United States Patent [19]

Shilo

[11] Patent Number: 5,072,187

[45] Date of Patent: Dec. 10, 1991

[54] METHOD AND APPARATUS FOR DETERMINING THE TOTAL HARMONIC DISTORTION AND POWER FACTOR OF A NON-LINEAR LOAD CIRCUIT

[75] Inventor: Marcel Shilo, Framingham, Mass.

[73] Assignee: Digital Equipment Corporation, Maynard, Mass.

[21] Appl. No.: 548,627

[22] Filed: Jun. 29, 1990

[51] Int. Cl.$^5$ .............................................. G01R 21/06
[52] U.S. Cl. ..................................... 324/623; 324/620
[58] Field of Search ............... 324/620, 623, 82, 83 R; 364/483, 492; 323/205, 212; 363/45, 46

[56] References Cited

U.S. PATENT DOCUMENTS

| | | | |
|---|---|---|---|
| 4,119,907 | 10/1978 | Quinn . | |
| 4,645,997 | 2/1987 | Whited . | |
| 4,677,366 | 6/1987 | Wilkinson et al. . | |
| 4,679,133 | 7/1987 | Moscovici | 363/46 |
| 4,683,529 | 7/1987 | Bucher, II . | |
| 4,818,947 | 4/1989 | Zucker et al. | 324/623 |
| 4,851,635 | 7/1989 | Farrow . | |
| 4,891,569 | 1/1990 | Light . | |

OTHER PUBLICATIONS

Nalbant, "Power Factor Enhancement Circuit," Micro Linear, Application Note 11, Feb. 1990.
"Input-Current Shaped Ac-to-Dc Converters," Final Report, California Institute of Technology Power Electronics Group EE116-81 (May 1986).
Digital Equipment document EL-00122-01, pp. 1-6-1-14 (Jun. 1983).
International Electrotechnical Commission, Technical Committee No. 77: "Electromagnetic Compatibility Between Electrical Equipment Including Networks,"
Subcommittee 77A: Equipment for Connection to the Public Low-Voltage Supply System (Jul. 1989).
Military Standard, "Interface Standard for Shipboard Systems, Section 300A, Electric Power, Alternating Current (Metric)", (Oct. 13, 1987).
"IEEE Guide for Harmonic Control and Reactive Compensation of Static Power Converters," ANSI/IEEE Std. 519 (1981),-Apr.
BMI 3030/3060 Power Profiler TM, "An instrument for measuring power, demand, cost and harmonics", 12-1989.
Kabis, "Power Meter—For Measurement of Primary Power", Power Supply (1988)-Jun.
Nalbant, "Power Factor Calculations and Measurements", APEC 1990 Fifth Annual IEEE Applied Power Electronics Conference and Exposition, (Mar. 11-16, 1990).
Janicke, Power Measurement Handbook, pp. 1-8 and 27 (1980/Dec.).
Yokogawa, "2350 Power Series", Brochure (undated) and Price Supplement (12/1989).

Primary Examiner—Jack B. Harvey
Attorney, Agent, or Firm—Finnegan, Henderson, Farabow, Garrett, and Dunner

[57] ABSTRACT

A method and apparatus for determining the total harmonic distortion and the power factor of a non-linear load circuit coupled to an a.c. power source generating a.c. current and a.c. voltage, the a.c. current input to the load circuit being in phase with the a.c. voltage provided across the load circuit by the a.c. power source. The invention measures the total harmonic distortion of a.c. current and a.c. voltage at the non-linear load circuit and calculates the total harmonic distortion and the power factor as a function of both.

30 Claims, 3 Drawing Sheets

METHOD AND APPARATUS FOR DETERMINING THE TOTAL HARMONIC DISTORTION AND POWER FACTOR OF A NON-LINEAR LOAD CIRCUIT

BACKGROUND OF THE INVENTION

1. Field of the Invention

The present invention relates to harmonic distortion and power factor measurements and, more specifically, to determining the total harmonic distortion and power factor of a non-linear load circuit coupled to an a.c. power source generating a.c. voltage and a.c. current, the a.c. current input to the load circuit being substantially in phase with the a.c. voltage provided across the non-linear load circuit by the a.c. power supply.

2. Description of the Related Art

Power factor is essentially a measurement of the efficiency of the use of a.c. power by a given load. A power factor equal to one (1) means the load is perfectly efficient.

Power factor considerations for electronic and electrical circuits and devices are becoming increasingly important in industry. It is in the best interest of any manufacturer of electronic and electrical devices to produce products which are as efficient as possible. This allows the manufacturer to promote improved performance specifications and to meet increasingly stringent industry standards. One technique used to improve the power factor of non-linear load devices includes adding active power factor correction circuitry to the device. However, even active power factor correction circuits cannot produce perfectly efficient devices.

Present techniques for determining the power factor of a device coupled to an a.c. power source may not provide an accurate power factor measurement, and can actually establish the device to be less efficient than it really is. These techniques assume an ideal a.c. power source where the a.c. voltage and a.c. current are perfect sinusoids, and attribute all inefficiencies or contributions to an observed power factor in the test circuit (consisting of the a.c. power source and the device under test) to the device under test, when in fact some of the circuit inefficiencies or contributions to the observed power factor are caused by the a.c. power source. This unfairly attributes all inefficiencies or contributions to the observed power factor to the device under test, and does not accurately reflect the true power factor of the device under test.

Generally, power factor (PF) is defined as the ratio of real power to apparent power:

$$PF = \frac{\text{real power}}{\text{apparent power}} \tag{1}$$

FIG. 1A shows a typical circuit representation of a load circuit under test for power factor and harmonic distortion considerations. Load circuit 5, having an impedance $Z_L$, is coupled to a.c. power source 6 having an impedance $Z_S$. The a.c. current i input to the load circuit 5 can be measured at the load using conventional techniques. Similarly, the a.c. voltage v at the input of the load circuit 5 caused by the a.c. power source 6 can be measured using conventional techniques.

If the system is purely resistive, $Z_L = R_l$ and $Z_S = R_S$ then, as shown in FIG. 1B, the voltage v and current i waveforms at the load circuit 5 are sinusoidal and in phase, assuming an ideal power source 6. Further, the power waveform p is the product of v and i at any one instant. This is also shown by phasor a in the phasor diagram of FIG. 1D, which represents the real power at the load circuit.

In practical applications, these ideal circumstances are rarely achieved and inefficiencies or contributions to the observed power factor exist. One contributing factor to these inefficiencies comes from the devices themselves which produce a phase difference between the fundamental components of the a.c. current and a.c. voltage at the load circuit. This is shown in FIG. 1C where the current waveform i lags the voltage waveform v by a phase angle $\phi$, and in FIG. 1D where phasor b, representing the fundamental apparent power, is offset from the real power phasor by angle $\phi$.

An additional contributing factor to the inefficiencies or the observed power factor of an electronic or electrical device comes from distortions of the voltage and current at the load circuit. This is shown in FIG. 1D as phasor c which represents to the total apparent power and which is offset from the fundamental apparent power by an additional phase angle $\delta$.

Thus, as shown by FIG. 1D, the general power factor equation of equation (1) can also be expressed as:

$$PF = \cos\phi \cos\delta \tag{2}$$

where $\cos\phi$ corresponds to the contributions to apparent power due to phase differences between the fundamental components of the voltage and current at the load, and $\cos\delta$ corresponds to contributions to apparent power due to the harmonic components of voltage and current at the load.

The present invention applies to non-linear load circuits at which the fundamental components of the a.c. voltage and a.c. current are substantially in phase, hence where there is no power factor degradation due to phase angle $\phi$. In other words, since phase angle $\phi$ is substantially equal to zero, $\cos\phi$ is equal to one, and the power factor degradation is attributable only to the harmonic distortions.

While it is known to determine power factor as a function of harmonic distortions at the load circuit, known measurement techniques in considering harmonic distortions typically consider only current distortions and assume that the a.c. voltage waveform is a distortion-free sinusoid and does not contribute harmonic distortions to the power factor determination. For example, typically the total harmonic distortion of a non-linear load circuit is determined by measuring the total harmonic distortion of only the a.c. current ($THD_i$) at the load circuit.

The power factor of the non-linear load circuit is then determined based on $THD_i$, according to the relationship:

$$PF = \frac{1}{\sqrt{1 + THD_i^2}} \tag{3}$$

Although this technique does provide a harmonic distortion and power factor measurement for non-linear load circuits when the current and voltage waveforms are in phase, it does not accurately reflect the power factor of the load circuit because it does not consider the total harmonic distortion and assumes that the a.c. voltage at the load circuit is a distortion-free sinusoidal waveform. In reality, this assumption is almost never true. A.c. power supplied by a utility company to a building generally encounters an internal non-linear impedance in the building which makes the a.c. voltage waveform output at one of the building's electrical wall sockets to be distorted.

In addition, the voltage waveform applied to the load circuit may vary depending on where the harmonic distortion or power factor measurement is being performed. For example, an a.c. voltage waveform from a utility a.c. power source in one room or on one floor of a building is often different from an a.c. voltage waveform from the same utility a.c. power source in another room or on another floor of the same building. Similarly, the voltage waveforms of the same utility a.c. power source will differ at different buildings.

Moreover, methods and devices for determining harmonic distortions and power factors which require an assumption that the a.c. voltage waveform at the load circuit is a distortion-free sinusoidal waveform provide inaccurate measurements because power factor degradation caused by the non-sinusoidal a.c. voltage of the a.c. power source is attributed to the load circuit, when in fact it comes in part from the a.c. power source connected to the load circuit.

Special purpose instruments exist for determining the power factor of a load circuit using the general expression:

$$PF = \frac{Watts}{V_{rms} \, i_{rms}} \quad (4)$$

However, these special purpose measurement instruments assume an ideal a.c. power source and have a number of other performance characteristics that limit their flexibility and applications. For example, these instruments often have limited bandwidth which limits the accuracy of power factor determination. They also suffer from lack of resolution when the power factor is very close to 1. Further, $V_{rms}$ and $i_{rms}$ measurements attribute the harmonic components of both v and i to the load circuit. This provides an inaccurate power factor measurement of the load circuit because distortions of the a.c. power source supplying the a.c. voltage are incorrectly attributed to the load circuit under test.

Some conventional techniques for determining total harmonic distortions and power factors of non-linear load circuits have attempted to account for the influence of harmonic distortions caused by the a.c. power source, by imposing standards for distortion of the a.c. voltage, when making current distortion measurements. For example, European Standards IEC-555-2 and Military Standards MIL-STD-1399 (Navy) §300A, list tolerance ranges of total voltage harmonic distortion when measuring the total current harmonic distortion at the load circuit. This fails to account for the actual distortion of the a.c. voltage across the load circuit.

SUMMARY OF THE INVENTION

Accordingly, it is an object of the present invention to provide a method and apparatus for accurately determining the total harmonic distortion and the power factor attributable only to a non-linear load circuit coupled to an a.c. power source when a.c. current input to the non-linear load circuit is substantially in phase with the a.c. voltage provided across the load circuit by the a.c. power source.

It is another object of the present invention to provide a method and apparatus for providing a determination of the total harmonic distortion and the power factor of a non-linear load circuit coupled to an a.c. power source when a.c. current input to the non-linear load circuit is substantially in phase with a.c. voltage provided across the load circuit as a function of both the total voltage harmonic distortion and the total current harmonic distortion of the load circuit.

It is another object of the present invention to provide a method and apparatus for providing a determination of the total harmonic distortion and the power factor of a non-linear load circuit coupled to an a.c. power source when a.c. current input to the non-linear load circuit is substantially in phase with the a.c. voltage provided across the load circuit by the a.c. power source, which is independent of the location at which the determination is made.

Additional objects and advantages of the present invention will become apparent from the description which follows.

In accordance with the invention, as embodied and broadly described herein, the invention provides an apparatus for determining the total harmonic distortion and power factor of a non-linear load circuit coupled to an a.c. power source that generates and supplies a.c. voltage and a.c. current, the a.c. current input to the non-linear load circuit being substantially in phase with the a.c. voltage provided across the load circuit by the a.c. power source, which comprises first means for measuring the total harmonic distortion of a.c. current ($THD_i$) input to the non-linear load circuit; second means for measuring the total harmonic distortion of a.c. voltage ($THD_v$) provided across the non-linear load circuit by the a.c. power source; and means for calculating the total harmonic distortion and/or the power factor as a function of both $THD_i$ and $THD_v$.

The invention also provides a method for determining the total harmonic distortion and power factor of a non-linear load circuit coupled to an a.c. power source that generates and supplies a.c. current and a.c. voltage to the load circuit, the a.c. current input to the non-linear load circuit being substantially in phase with the a.c. voltage supplied across the load circuit by the a.c. power source, which comprises the steps of measuring the total harmonic distortion of a.c. current ($THD_i$) input to the non-linear load circuit; measuring the total harmonic distortion of a.c. voltage ($THD_v$) provided across the non-linear load circuit by the a.c. power source; and operating a computational unit in accordance with a predetermined relationship which takes into account both $THD_i$ and $THD_v$ to determine the total harmonic distortion and/or the power factor as a function of both $THD_i$ and $THD_v$.

The invention further provides an apparatus for determining the power factor (PF) of a non-linear load circuit coupled to an a.c. power source that generates and supplies a.c. current and a.c. voltage to the load circuit, the a.c. current input to the non-linear load circuit being substantially in phase with the a.c. voltage supplied across the load circuit by the a.c. power source, comprising first means for measuring the total harmonic distortion of a.c. current ($THD_i$) input to the non-linear load circuit; second means for measuring the total harmonic distortion of a.c. voltage ($THD_v$) provided across the non-linear load circuit by the a.c. power source; and means, coupled to the first and second means, for separating out contributions to an observed power factor provided by circuit components other than the non-linear load circuit.

The invention further provides a method of determining power factor (PF) of a nonlinear load circuit coupled to an a.c. power source that generates and supplies a.c. current and a.c. voltage to the load circuit, the a.c. current input to the load circuit being substantially in phase with the a.c. voltage supplied across the load circuit by the a.c. power source, the method comprising the steps of measuring the total harmonic distortion of the a.c. current ($THD_i$) input to the non-linear load circuit from the a.c. power source; measuring the total harmonic distortion of the a.c. voltage ($THD_v$) provided across the non-linear load circuit by the a.c. power source; and separating out contributions to an observed power factor provided by circuit components other than the non-linear load circuit.

BRIEF DESCRIPTION OF THE DRAWINGS

The accompanying drawings, which are incorporated in and constitute a part of the specification, illustrate presently preferred embodiments and methods of carrying out the invention and, together with the general description above and the detailed description of the preferred embodiments and methods given below, serve to explain the objects, advantages and principles of the invention. Of the drawings.

DESCRIPTION OF THE PREFERRED METHODS AND EMBODIMENTS

In accordance with the invention, a method and an apparatus are provided for determining the total harmonic distortion and the power factor of a non-linear load circuit coupled to an a.c. power source that generates and supplies a.c. voltage and a.c. current to the load circuit, when the a.c. current input to the load circuit is substantially in phase with the a.c. voltage provided across the load circuit by the a.c. power source.

Figure 1A:
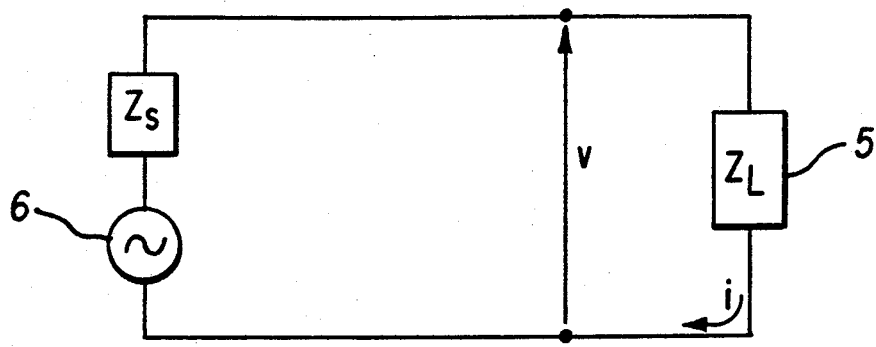
FIG. 1A is a circuit diagram of a load circuit connected to an a.c. power source.
Figure 1B:
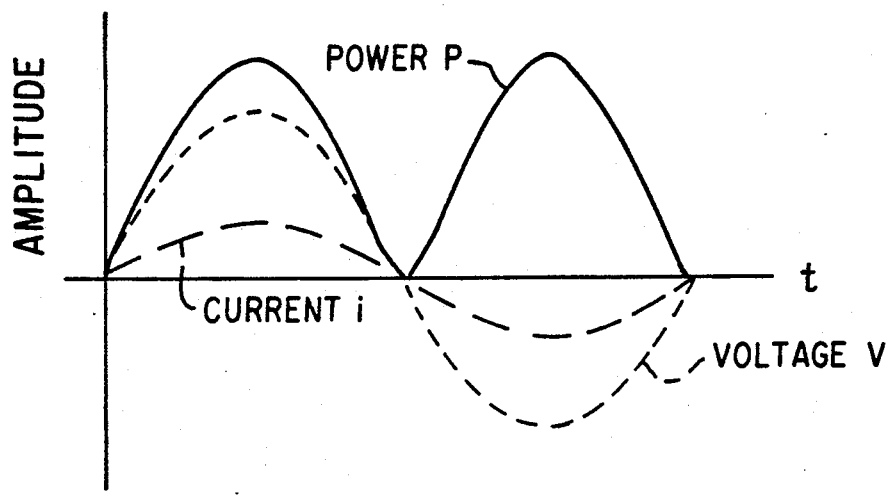
FIG. 1B is a waveform diagram of the voltage, current and power waveforms at the input of the load circuit of FIG. 1A, assuming a resistive load.
Figure 1C:
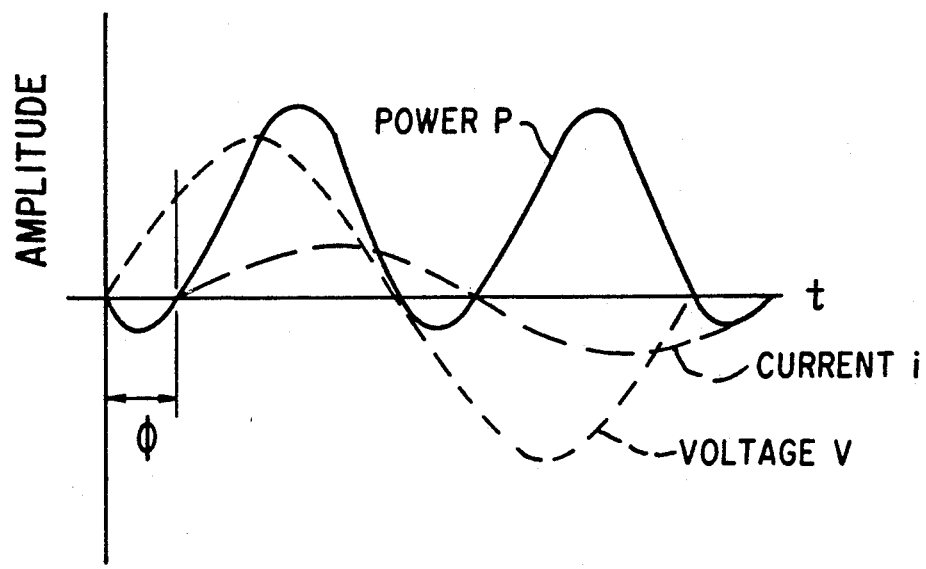
FIG. 1C is a waveform diagram of the voltage, current and power waveforms at the input of the load circuit of FIG. 1A, where the current waveform lags the voltage waveform.
Figure 1D:
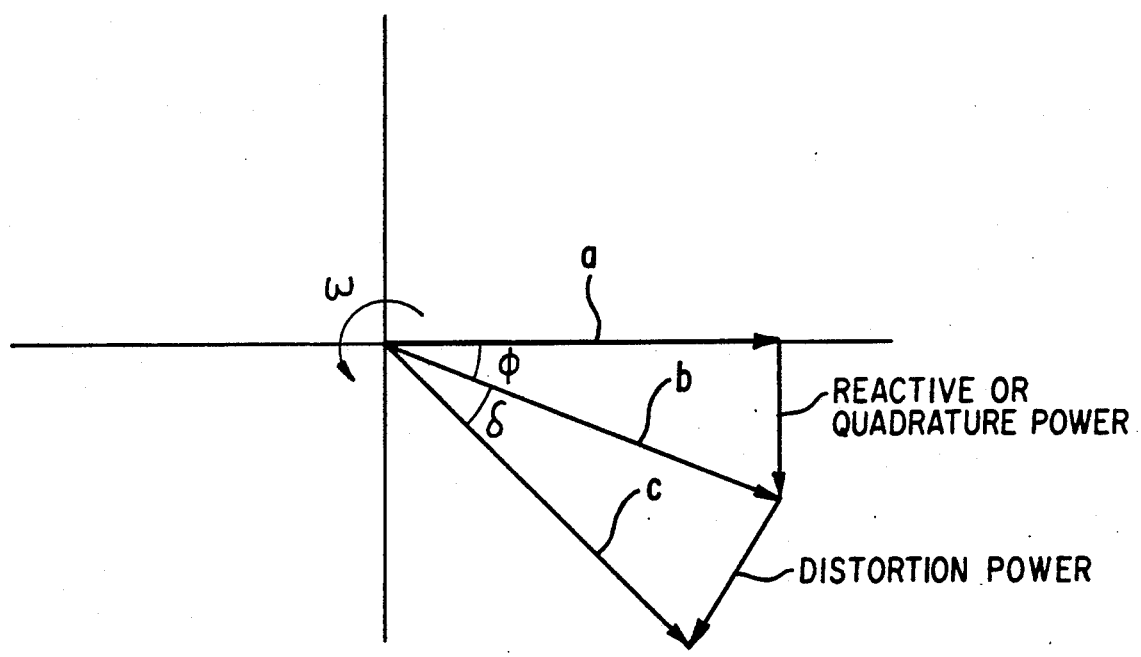
FIG. 1D is a phasor diagram showing phasors for a load circuit having phase displacement and harmonics distortions.
Figure 2:
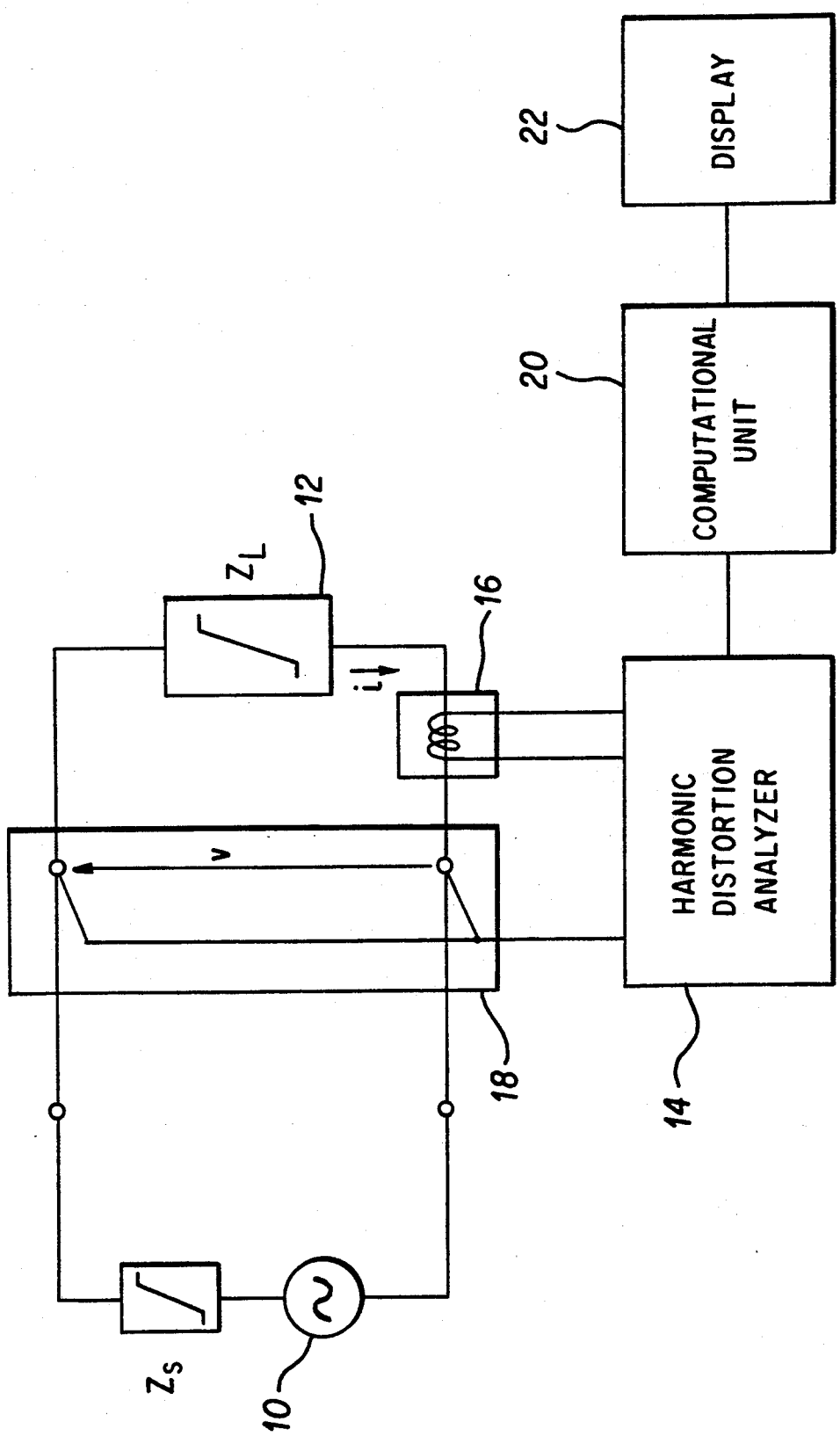
FIG. 2 is a diagram of an apparatus for determining the total harmonic distortion and the power factor of the load circuit constructed in accordance with the present invention.

As illustrated in FIG. 2, an a.c. power source 10 may provide a distorted sinusoidal voltage waveform and a distorted sinusoidal current waveform to load circuit 12 comprising a non-linear load $Z_L$. These waveforms are substantially in phase. Non-linear load circuit 12 may comprise a circuit, such as a switching power supply or a fluorescent lighting circuit, having active power factor correction; however, the invention applies to any non-linear load circuit at which the input a.c. current is substantially in phase with the input a.c. voltage. The non-linear load circuit 12 is connected to a.c. power source 10, which preferably corresponds to a conventional utility a.c. power source or any laboratory a.c. source instrument.

In accordance with the invention, first means are provided for measuring the total harmonic distortion of a.c. current ($THD_i$) input to the non-linear load circuit. As embodied in FIG. 2, this first means may include a harmonic distortion analyzer 14 and a current probe 16. Numerous commercial harmonic distortion analyzers exist for measuring total harmonic distortion of a.c. current, and the present invention contemplates the use of any of these analyzers. Examples of these analyzers include the HP 35660A, manufactured by the Hewlett-Packard Company and the BMI 3030/3060 POWER PROFILER™, manufactured by Basic Measuring Instruments. These instruments provide good calibration and traceability. In general, however, any type of frequency-domain instrumentation (frequency spectrum analyzer) or time-domain instrumentation (digital filters, FFTs) may be used to measure the voltage and current distortions at the load circuit. The distortion analyzer selected preferably provides about 2 to 6 kHz of bandwidth to account for all harmonics that contribute significantly to the measurement based on a desired level of accuracy. Likewise, numerous commercial current probes and transformers exist and the invention contemplates the use of any of these which provide an accurate current measurement of the current input to the non-linear load circuit 12. Preferably, the current probe 16 is insulated from the non-linear load circuit 12.

In accordance with the invention, second means are provided for measuring the total harmonic distortion of a.c. voltage ($THD_v$) across the non-linear load circuit. As embodied in FIG. 2, this second means may include a harmonic distortion analyzer 14 and a voltage probe 18. Preferably, harmonic distortion analyzer 14 receives inputs from both current probe 16 and voltage probe 18, as shown, and measures the harmonic distortion of both the current ($THD_i$) and voltage ($THD_v$) input to the load circuit 12; however, separate analyzers can also be provided to measure separately the a.c. current distortion and the a.c. voltage distortion, respectively. Voltage probe 18 preferably includes an isolated wideband voltage tap. Numerous commercial voltage probes are also available, and the invention may use any of these which provide the desired accuracy of measurement of the voltage input across the non-linear load circuit 12.

Also in accordance with the invention, means may be coupled to the first and second means for calculating the total harmonic distortion (THD) and the power factor (PF) of the non-linear load circuit as a function of both $THD_i$ and $THD_v$. This means may include a computational unit 20 connected to harmonic distortion analyzer 14. Computational unit 20 may comprise any programmable processing unit and related circuitry or computer such as a special or general purpose computer, microprocessor, etc., to perform calculations corresponding to the relationships identified below. For example, a personal computer may be programmed in accordance with these relationships and coupled to harmonic distortion analyzer 14 for calculating power factor or total harmonic distortion. Alternatively, many commercial harmonic distortion analyzers are themselves programmable, and the computational unit 20 may be embodied within the harmonic distortion analyzer 14. If separate analyzers are employed to measure separately a.c. current and voltage distortions, they can be connected individually to computational unit 20.

As further shown in FIG. 2, computational unit 20 may be connected to a display 22 to display the results of the calculation of either THD or the power factor of the load circuit 12, or both as desired. This display may include any type of analog or digital, textual or graphical indication of the result. Most commercially available harmonic distortion analyzers generally include some form of display, and display 22 may correspond to the normal display of the harmonic distortion analyzer 14.

In accordance with the invention, the total harmonic distortion (THD) of a non-linear load coupled to an a.c. power source which generates a.c. current and a.c. voltage, where the a.c. current input to the load circuit is substantially in phase with the a.c. voltage provided across the load circuit by the a.c. power source, is determined according to the relationship:

$$THD = \sqrt{\frac{(THD_i)^2 - (THD_v)^2}{1 + (THD_v)^2}} \quad (5)$$

The derivation of this relationship will now be described.

It is known that in the absence of current distortion the a.c. current is a pure sinusoid and there are no current harmonics. Thus, $$\frac{i^2}{i_1^2} = 1 \quad (6)$$

where i is the total current supplied to the non-linear load circuit 12, and $i_1$ is the fundamental component of the current supplied to the non-linear load circuit 12.

Similarly, it is also known that in the absence of voltage distortion the a.c. voltage is a pure sinusoid and there are no voltage harmonics. Thus, $$\frac{v^2}{v_1^2} = 1 \quad (7)$$

where v is the total voltage across the non-linear load circuit 12, and $v_1$ is the fundamental component of the voltage.

In general, the power ratio of the load circuit 12 can be represented as:

$$\frac{\frac{i^2 \cdot Z_L}{i_1^2 \cdot Z_L}}{\frac{v^2/Z_L}{v_1^2/Z_L}} \quad (8)$$

where $Z_L$ is the impedance of load circuit 12.

This ratio reduces to the following ratio:

$$\frac{\frac{i^2}{i_1^2}}{\frac{v^2}{v_1^2}} \quad (9)$$

Expanding the total current, i, and total voltage, v, into their harmonic components yields:

$$\frac{\frac{i_1^2 + i_2^2 + i_3^2 + \ldots i_n^2}{i_1^2}}{\frac{v_1^2 + v_2^2 + v_3^2 + \ldots v_n^2}{v_1^2}} \quad (10)$$

where $i_n$ is the current value of the "nth" harmonic current component and $v_n$ is the voltage value of the "nth" harmonic voltage component.

This ratio can be rewritten as:

$$\frac{1 + \frac{\sum_{n=2}^{\infty} i_n^2}{i_1^2}}{1 + \frac{\sum_{n=2}^{\infty} v_n^2}{v_1^2}} \quad (11)$$

The total harmonic distortion of a current ($THD_i$) or voltage ($THD_v$) is equal to the square root of the sum of squares of all of the harmonic components of the current or voltage, divided by the fundamental component of the current or voltage. Thus, squaring $THD_i$ and $THD_v$ yields the relationships:

$$THD_i^2 = \frac{\sum_{n=2}^{\infty} i_n^2}{i_1^2} \quad (12)$$

and $$THD_v^2 = \frac{\sum_{n=2}^{\infty} v_n^2}{v_1^2} \quad (13)$$

Substituting relationships (12) and (13) into ratio (11) provides the following ratio for a real system:

$$\frac{1 + (THD_i)^2}{1 + (THD_v)^2} \quad (14)$$

In real systems, $THD_i$ is always greater than or equal to $THD_v$ and in most cases $THD_i$ is greater than $THD_v$. Accordingly, relationship (14) will in most cases be greater than 1. The amount by which ratio (14) is greater than 1 depends upon the values of both $THD_v$ and $THD_i$ at the load circuit 12. This amount is related to the square of the total harmonic distortion $(THD)^2$ at the load circuit 12, and it is a function of both $(THD_v)^2$ and $(THD_i)^2$. Ratio (14) may be set equal to 1 plus the square of THD such that:

$$\frac{1 + (THD_i)^2}{1 + (THD_v)^2} = 1 + THD^2 \quad (15)$$

Accordingly:

$$THD^2 = \frac{1 + (THD_i)^2}{1 + (THD_v)^2} - 1 \quad (16)$$

Which can be rewritten as:

$$THD^2 = \frac{(THD_i)^2 - (THD_v)^2}{1 + (THD_v)^2} \quad (17)$$

Thus, in accordance with the invention, the total harmonic distortion THD can be determined as a function of both $THD_v$ and $THD_i$ as:

$$THD = \sqrt{\frac{(THD_i)^2 - (THD_v)^2}{1 + (THD_v)^2}} \quad (18)$$

The calculation represented by equation (18) can be programmed into computational unit 20, and THD can be calculated as a function of both $THD_v$ and $THD_i$.

In accordance with the invention, the power factor of a nonlinear load circuit coupled to an a.c. power source that generates a.c. current and a.c. voltage, where the a.c. current input to the load circuit is substantially in phase with the a.c. voltage provided across the load circuit by the a.c. power source, is determined according to the relationships:

$$PF = \frac{1}{\sqrt{\frac{1 + (THD_i)^2}{1 + (THD_v)^2}}} \quad (19)$$

or:

$$PF = \frac{1}{\sqrt{1 + \frac{(THD_i)^2 - (THD_V)^2}{1 + (THD_v)^2}}} \quad (20)$$

These relationships may be derived by substituting $THD^2$ as defined in equation (16) into power factor equation (3), in which only $THD_i$ has previously been considered. This substitution yields equation (20), which can also be represented by equation (19).

As embodied herein, the computation represented by either of relationships (19) and (20) can be programmed into computational unit 20 to provide a power factor determination.

Using the foregoing methods and apparatus described above, the present invention enables determination of the total harmonic distortion and the power factor of a non-linear load coupled to an a.c. power source with substantially greater accuracy than conventional methods and apparatus, since the method and apparatus of the present invention do not attribute inefficiencies or contributions to the observed power factor due to the a.c. power source to the load circuit. In this manner, the invention does not penalize the owner of the load circuit as in the prior art.

Additional advantages of the invention and modifications to the embodiments described above will readily occur to those skilled in the art. The invention is not limited to the specific details and representative embodiments and methods disclosed and illustrated herein. For example, other suitable relationships for determining THD and power factor may be used by computational unit 20 to calculate THD and the power factor as a function of both $THD_i$ and $THD_v$. Other departures may be made from the described embodiments without departing from the spirit of the invention, the scope of which is defined by the appended claims.

What is claimed is:

1. An apparatus for determining the power factor (PF) of a non-linear load circuit coupled to an a.c. power source that generates and supplies a.c. current and a.c. voltage to the load circuit, the a.c. current input to the non-linear load circuit being substantially in phase with the a.c. voltage supplied across the load circuit by the a.c. power source, comprising:

first means for measuring the total harmonic distortion of a.c. current ($THD_i$) input to the non-linear load;

second means for measuring the total harmonic distortion of a.c. voltage ($THD_v$) provided across the non-linear load circuit by the a.c. power source; and means, coupled to the first and second means, for calculating the power factor of the non-linear load circuit as a function of both $THD_i$ and $THD_v$.

2. An apparatus according to claim 1, wherein the means for calculating the power factor includes means for determining the power factor according to the relationship:

$$PF = \frac{1}{\sqrt{\frac{1 + (THD_i)^2}{1 + (THD_v)^2}}}.$$

3. An apparatus according to claim 1, wherein the means for calculating the power factor includes means for determining the power factor according to the relationship:

$$PF = \frac{1}{\sqrt{1 + \frac{(THD_i)^2 - (THD_V)^2}{1 + (THD_v)^2}}}.$$

4. An apparatus according to claim 1, wherein the first means for measuring $THD_i$ comprises a harmonic distortion analyzer and an a.c. current probe for detecting a.c. current.

5. An apparatus according to claim 1, wherein the second means for measuring $THD_v$ comprises a harmonic distortion analyzer and an a.c. voltage probe for detecting a.c. voltage.

6. An apparatus according to claim 1, wherein the means for calculating the power factor comprises a computational unit.

7. An apparatus according to claim 1, wherein the means for calculating the power factor includes a programmable processor.

8. An apparatus according to claim 1, further comprising a display connected to the means for calculating the power factor for displaying the power factor.

9. An apparatus according to claim 1, wherein each of the means is provided in a single piece of programmable electrical test equipment.

10. An apparatus according to claim 1, further comprising:

means, coupled to the first and second means, for calculating total harmonic distortion (THD) of the non-linear load circuit as a function of both $THD_i$ and $THD_v$.

11. An apparatus according to claim 10, wherein the means for calculating the total harmonic distortion (THD) includes means for calculating the total harmonic distortion according to the relationship:

$$THD = \sqrt{\frac{(THD_i)^2 - (THD_v)^2}{1 + (THD_v)^2}}.$$

12. An apparatus according to claim 10, wherein the means for calculating the total harmonic distortion comprises a computational unit.

13. An apparatus according to claim 10, wherein the means for calculating the total harmonic distortion includes a programmable processor.

14. An apparatus according to claim 10, further comprising a display connected to the means for calculating the total harmonic distortion for displaying the total harmonic distortion.

15. An apparatus according to claim 10, wherein each of the means is provided in a single piece of programmable electrical test equipment.

16. An apparatus for determining the power factor (PF) of a non-linear load circuit coupled to an a.c. power source that generates and supplies a.c. current and a.c. voltage to the load circuit, the a.c. current input to the non-linear load circuit being substantially in phase with the a.c. voltage supplied across the load circuit by the a.c. power source, comprising:

first means for measuring the total harmonic distortion of a.c. current ($THD_i$) input to the non-linear load;

second means for measuring the total harmonic distortion of a.c. voltage ($THD_v$) provided across the non-linear load circuit by the a.c. power source; and means, coupled to the first and second means, for separating out contributions to an observed power factor provided by circuit components other than the non-linear load circuit.

17. An apparatus according to claim 16, further comprising means for displaying the power factor of the non-linear load circuit based on contributions to the observed power factor provided only by the non-linear load circuit.

18. An apparatus according to claim 16, wherein the means for separating includes means for calculating the power factor of the non-linear load circuit as a function of both $THD_i$ and $THD_v$.

19. An apparatus according to claim 18, wherein the means for calculating the power factor includes means for calculating the power factor according to the relationship:

$$PF = \frac{1}{\sqrt{\frac{1 + (THD_i)^2}{1 + (THD_v)^2}}}.$$

20. An apparatus according to claim 18, wherein the means for calculating the power factor includes means for calculating the power factor according to the relationship:

$$PF = \frac{1}{\sqrt{1 + \frac{(THD_i)^2 - (THD_V)^2}{1 + (THD_v)^2}}}.$$

21. A method of determining power factor (PF) of a non-linear load circuit coupled to an a.c. power source that generates and supplies a.c. current and a.c. voltage to the load circuit, the a.c. current input to the load circuit being substantially in phase with the a.c. voltage supplied across the load circuit by the a.c. power source, the method comprising the steps of:

measuring the total harmonic distortion of the a.c. current ($THD_i$) input to the non-linear load circuit by the power source;

measuring the total harmonic distortion of the a.c. voltage ($THD_v$) provided across the non-linear load circuit by the a.c. power source; and operating a computational unit in accordance with a predetermined relationship which takes into account both $THD_i$ and $THD_v$ to determine the power factor (PF) of the non-linear load circuit as a function of both $THD_i$ and $THD_v$.

22. A method according to claim 21, wherein the operating step includes the step of calculating the power factor according to the relationship:

$$PF = \frac{1}{\sqrt{\frac{1 + (THD_i)^2}{1 + (THD_v)^2}}}.$$

23. A method according to claim 21, wherein the operating step includes the step of calculating the power factor according to the relationship:

$$PF = \frac{1}{\sqrt{1 + \frac{(THD_i)^2 - (THD_V)^2}{1 + (THD_v)^2}}}.$$

24. A method according to claim 21, further comprising the step of displaying the calculated power factor.

25. A method according to claim 21, further comprising the steps of:

operating a computational unit in accordance with a predetermined relationship which takes into account both $THD_i$ and $THD_v$ to determine the total harmonic distortion (THD) of the non-linear load circuit as a function of both $THD_i$ and $THD_v$.

26. A method according to claim 25, wherein the operating step includes the step of calculating the total harmonic distortion (THD) according to the relationship:

$$THD = \sqrt{\frac{(THD_i)^2 - (THD_v)^2}{1 + (THD_v)^2}}.$$

27. A method according to claim 25, further comprising the step of displaying the calculated total harmonic distortion.

28. A method of determining power factor (PF) of a non-linear load circuit coupled to an a.c. power source that generates and supplies a.c. current and a.c. voltage to the load circuit, the a.c. current input to the load circuit being substantially in phase with the a.c. voltage supplied across the load circuit by the a.c. power source, the method comprising the steps of:

measuring the total harmonic distortion of the a.c. current ($THD_i$) input to the non-linear load circuit from the a.c. power source;

measuring the total harmonic distortion of the a.c. voltage ($THD_v$) provided across the non-linear load circuit by the a.c. power source; and separating out contributions to an observed power factor provided by circuit components other than the non-linear load circuit.

29. A method according to claim 28, wherein said separating step includes the step of calculating the power factor according to the relationship:

$$PF = \frac{1}{\sqrt{\frac{1 + (THD_i)^2}{1 + (THD_v)^2}}}.$$

30. A method according to claim 28, wherein said separating step includes the step of calculating the power factor according to the relationship:

$$PF = \frac{1}{\sqrt{1 + \frac{(THD_i)^2 - (THD_V)^2}{1 + (THD_v)^2}}}.$$

* * * * *

UNITED STATES PATENT AND TRADEMARK OFFICE
CERTIFICATE OF CORRECTION

PATENT NO. : 5,072,187
DATED : December 10, 1991
INVENTOR(S) : Marcel Shilo

It is certified that error appears in the above-identified patent and that said Letters Patent is hereby corrected as shown below:

Claim 21, column 12, line 10, change "by the" to --from the a.c.--.

Claim 25, column 12, line 40, change "steps" to --step--.

Signed and Sealed this

Twenty-eighth Day of September, 1993

Attest:

BRUCE LEHMAN

*Attesting Officer*     *Commissioner of Patents and Trademarks*